United States Patent [19]

Scari et al.

[11] Patent Number: 5,662,990

[45] Date of Patent: Sep. 2, 1997

[54] GLASS FABRIC PRODUCED WITH ZERO-TWIST YARN

[75] Inventors: Diego Scari; Marco Scari, both of Brugherio, Italy

[73] Assignee: Gividi Italia S.p.A., Milan, Italy

[21] Appl. No.: 615,316

[22] PCT Filed: Jul. 14, 1995

[86] PCT No.: PCT/EP95/02757

§ 371 Date: Mar. 18, 1996

§ 102(e) Date: Mar. 18, 1996

[87] PCT Pub. No.: WO96/02692

PCT Pub. Date: Feb. 1, 1996

[30] Foreign Application Priority Data

Jul. 19, 1994 [IT] Italy ................................. MI94A1498

[51] Int. Cl.[6] .................................................. D03D 3/00
[52] U.S. Cl. .................... 442/189; 139/11; 139/420 C; 139/426 TW; 428/902; 428/219; 428/220; 442/203; 442/208

[58] Field of Search .................................. 428/225, 229, 428/257, 258, 268, 902, 219, 220; 139/11, 420 C, 426 TW

[56] References Cited

U.S. PATENT DOCUMENTS 4,543,113  9/1985  Forester et al. ............................ 55/378

FOREIGN PATENT DOCUMENTS 790216  2/1958  United Kingdom.

Primary Examiner—James J. Bell
Attorney, Agent, or Firm—Griffin, Butler, Whisenhunt & Kurtossy

[57] ABSTRACT

The present invention relates to a glass fabric produced with zero-wist yarn, its use an the manufacture of printed circuits and in numerous other industrial applications, as well as to a process for the manufacture thereof.

9 Claims, 1 Drawing Sheet

PROFILE OF FABRIC

PROFILE OF FABRIC
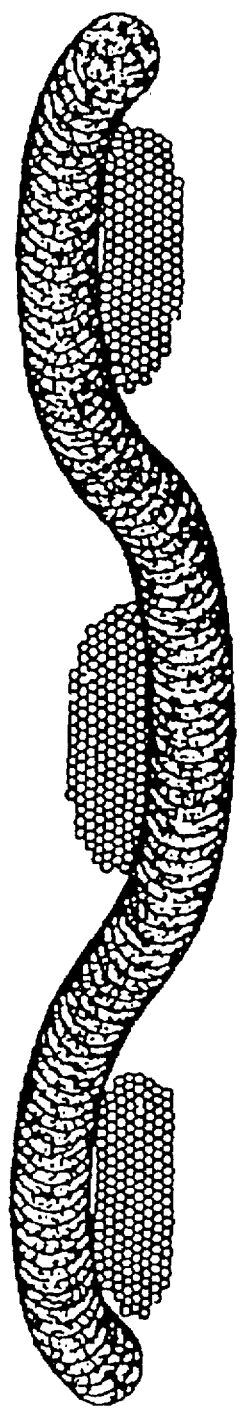
FIG. 1A WITH TWISTED YARN
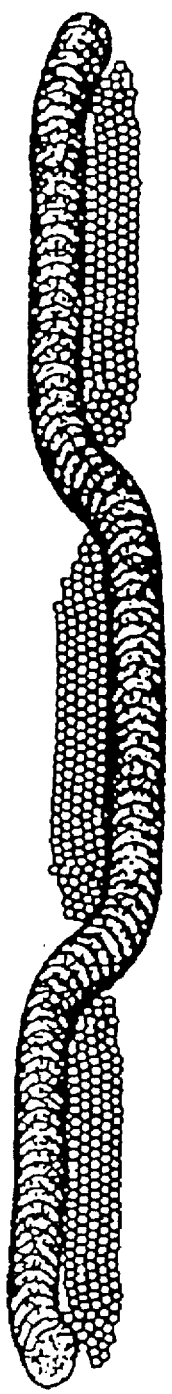
FIG. 1B WITH PARALLEL YARN (# GLASS FABRIC PRODUCED WITH ZERO-TWIST YARN)

The present invention relates to a glass fabric produced with zero-twist yarn, its use in the manufacture of printed circuits and in numerous other industrial applications, as well as to a process for the manufacture hereof.

BACKGROUND OF THE INVENTION

Glass fabric is used today with success in the most varied applications. The most important include those relating to advanced structural composites for the aeronautical and ship-building industries and dielectric composites for the electrical and electronics industry.

In particular, the Applicant is interested in the manufacture of glass fabrics for use in the electrical and electronics industry, preferably the construction of laminates for printed circuits and the manufacture of fabrics and gauzes used as a reinforcement in numerous industrial applications.

Printed circuits nowadays represent the most widespread and effective support medium for electronic equipment, ensuring both the mechanical anchoring and electrical connection of the associated components, and it is not possible to foresee any other connecting systems capable of replacing them in the medium or short term.

Consequently the laminates required for their construction have an important role and it is expected that their production volume will steadily increase for many years to come.

The printed circuits and the laminates used for their construction are required to have increasingly superior characteristics as a result of the evolution of microelectronics technology which enables an increasingly large number of logic circuits to be concentrated on the chips or on the physical support components.

The miniaturization of electronics devices has given rise to various assembly problems including the increased concentration of tracks on the printed circuits and hence the need to make them thinner.

As a result the amount of copper adhering to the laminate must be reduced. Under the impetus of this requirement, the thickness of the copper lamina of the printed circuits has been reduced, in a few years, from 70 microns to 35 and 18 microns, and the tendency is to reduce it still further to 12, or even 9 microns.

This innovative process has not radically affected the production criteria for laminates, but has made it necessary to use glass fabrics which are much more refined than those currently used.

In particular, textile manufacturers are being required to find, with increasing urgency, solutions to the problems associated with the surface of the fabrics which must always be flat and smooth and as far as possible free from loose strands and textile defects in general. In fact any filaments of the glass yarn present on the surface of the laminate penetrate into the copper during the pressing process, while rougher surfaces diminish the adhesion of the copper lamina to the support base of the epoxy-glass laminate.

State of the Art

The requisites for the supporting glass fabrics in laminates for printed circuits are closely linked to the performance required of the latter.

The laminate which is currently most widespread—called FR—4—has the characteristics shown in the table below:

TABLE

| Technical characteristics of the laminate FR-4 | |
| --- | --- |
| $\epsilon$ | 4 |
| Tg (°C.) | 140 |
| HPCT (hours) | 2 |
| VO (pass/fail) | Pass |
| $C_u$ (N/mm) | 2 |
| $\alpha_z$ (ppm/°K.) | 200 |
| P(t) (µm) | 5 |
| D stab (ppm) | 400 |

$\epsilon$ = Dielectric constant
Tg = Glass transition temperature
HPCT = High Pressure Cooker Test
VO = Self-extinguishing characteristics (in accordance with UL 94)
$C_u$ = Bonding strength (copper to epoxy-glass laminate)
$\alpha_z$ = Heat expansion coefficient on Z axis
P(t) = Surface profile
D stab = Dimensional stability The parameters Tg, VO, $C_u$ are influenced mainly by the characteristics of the resin used in the laminates, while the parameters $\epsilon$, $\alpha_z$, P(t) and D stab are directly influenced by the characteristics of the fabrics.

Since the boards used for the production of printed circuits increasingly take the form of products intended for high-precision engineering it is of fundamental importance to improve the parameters of the second category, i.e. obtain perfect "monolithicity" of the resin with the glass fabric.

For example, high values of the heat expansion coefficient on the Z axis, $\alpha_z$, cannot be tolerated, because the latter, during the chemical and heat processes to for processing of the laminate, may give rise deformations of the printed circuit board, making difficult to apply the electrical components onto the board itself. Moreover, the components themselves, once fixed and operative, dissipate a considerable quantity of thermal energy, causing non-uniform thermal conditions in various points on the board which, at high values of $\alpha_z$ may cause serious problems of "resistance" of the epoxy glass laminate.

The situation becomes extremely delicate when the boards are formed by multi-layer laminates. In this case the value $\alpha_z$ becomes of extreme importance.

Poor dimensional stability, for example owing to non-uniform impregnation of the fabric by the resin or owing to undesired displacements of the yarns inside the fabrics, or also owing to internal tension of the laminate, may adversely affect the electrical and mechanical characteristics of the printed circuit board.

It should be remembered in this connection that the copper tracks on a very fine line board have a width of 60–70 µm and are located at about 100 µm from each other. Clearly in these conditions a slight local deformation may compromise the integrity of the tracks or the insulation between them or adversely affect the values of the electrical and parasitic magnetic parameters.

It must also be noted that the configurations of the glass support medium may indirectly affect the parameters $C_u$ and $\epsilon$. If, for example, the fabric is not suitable for promoting the resin impregnation process, small cavities may form in the laminate and falsify the values of $\epsilon$ and cause it to vary irregularly from zone to zone, as in the case of a faulty dielectric of a capacitor. This causes a precarious situation with regard to control of the disturbances during the transmission of the signals (nowadays high-frequency) via the printed circuit connections.

As regards the processability of the board, this is represented in particular by its suitability for hole-boring. It is known that the holes are essential elements in a printed circuit board. The must be suitability metallized, i.e. the internal surface of the hole must be covered with a conductive metal, normally copper.

Producing laminates which can be easily processed ensures that properly metallized holes are obtained. The fabrics produce using yarns with 0–6 twists per meter would also ensure in this case a considerable increase in performance since they reduce substantially the intrinsic strand-cutting resistance of the twisted yarns.

HPCT is an accelerated ageing test for the laminate which is first immersed for one hour in boiling water under pressure and then dipped into a molten tin bath at 260° C. or at least 20 seconds there must be no blistering or "measling" on the laminate, thus indicating an adequate strength of the bond between glass and resin. This is fundamental for ensuring good results as regards the process involving preparation, assembly and soldering of the printed circuits. This strength depends to a large extent on the quality of impregnation of the fabric. Air pockets, referred to as "voids" (which occur mainly between filaments inside an individual yarn), favour the penetration of moisture which causes delamination of the laminate. It would be expected that fabrics produced using yarn with 0–6 twists per meter eliminate significantly this phenomenon since they favour the maximum wettability of each individual filament (in these yarns the filament compression component resulting from the tension of the twisted yarn is practically non-existent and a yarn with clearly separated filaments is obtained), thus resulting in optimum impregnation of the entire fabric.

Another parameter which is of increasing importance is that of the profile of the surface of the laminates in the form of its two components Roughness, R(t) and Wariness, W(t). The present values of P(t) do not allow full exploitation of advanced techniques for production of the finished board such as surface mounting or even that of direct application of the copper tracks onto the laminate. The evenness of the laminate is therefore decisive in view of the increasingly high frequencies of use to which the laminates will be subjected. In order to achieve these performance features, current technology is based above all on reduction in the size of the tracks and the distances between the various components "applied" onto the laminate (i.e. an increase in the density of the circuits ). The result on laminates is that not only must the tracks be made narrower (60–70 μm), but their thickness must also be reduced on account of the "aspect ratio" (less than 10 μm). It is obvious that such small dimensions of the copper tracks require a perfect adherence to the laminate which can only be guaranteed by optimum evenness.

In addition to the technical parameters of the laminates for printed circuits, it is necessary to take into account the price, which has a significant impact on the cost of finished products for mass consumption. The price must therefore be kept low, while improving the technical characteristics of the laminates themselves.

In the industrial sector fabrics which use zero-twist yarns are already known. This yarn is known as "roving" and has micron diameter values and yarn counts much higher than those to which the present invention refers.

The high weight in grams provides these yarns with the strength necessary for them to be produced and hence woven without major problems. However, the situation is different as regards those fabrics with industrial uses which are manufactured using yarns associated with electronics applications, i.e. yarns from 5.5 to 136 Tex and with diameter values of 5 to 9 microns. In fact, as with fabrics intended for the electronics sector, the are currently produced using yarns with 28 to 40 twisting turns; the intrinsic weakness of the yarns of this weight hitherto has not permitted manufacture with zero twisting turns nor weaving.

The present invention, as regards uses in the industrial sector therefore refers solely to those fabrics which are currently produce using yarns with 28 to 40 twisting turns and with a yarn count of between 5.5 and 136 Tex.

These fabrics, if produced with yarns having the same gram weight and with zero twists, would have an improved reinforcing function, i.e. the most important function which is required of glass fabrics in these applications.

It is in fact known to the person skilled in the art that the rigidity coefficient of glass decreases with an increase in the number of twists. Furthermore, the improved intrinsic wettability of fabrics with zero twists makes it possible to obtain, for the same overall weight, a preimpregnated product with greater glass content, thus improving the mechanical and reinforcing properties of the preimpregnated product itself. In those applications where the thickness is a characteristic of primary importance (cf. the reinforcements in adhesive tapes), a more even fabric, such as that manufactured using zero-twist yarns, reduces the risk of tearing of cardboard-box sealing tape following impact with other surfaces owing to its extremely limited excess thickness.

Moreover, considerations of an economic nature are also of extreme importance; the glass fabric manufactured with zero-twist yarns offers considerable economic advantages compared to conventional glass fabric.

Generally in industrial applications where the mechanical characteristics and the cost are of primary importance, the glass fabrics forming the subject of this invention represent a considerable competitive advantage in terms of both quality and cost.

Yarn Manufacturing Process

The glass fabric used for the aforementioned purposes is produced by processing E-glass (borosilicate) yarns.

The technique for the spinning of textile E-glass fibres is performed as follows: a composition of selected raw materials (borosilicate) is fed into a melting furnace which, heated to 1700° C., transforms the sand into a fluid product. This homogeneous fluid is made to flow above the spinneret.

The spinneret is a meal plate made from platinum/rhodium alloys with a lot of holes referred to as nozzles. The spinneret is heated by the Joule effect, being an integral part of an electric circuit. At a temperature of about 1100° C. (under the holes in suitable conditions), the liquid emerges from the holes in the plate and forms as many droplets as there are openings (50, 100, 200 or 400 in number). Each droplet, upon reaching a certain size, separates from the metal forming a strand which, if it has a sufficient mass, continues to exert a pulling force on the liquid which emerges from the holes, giving rise to a continuous strand. For the same (mass) flow through the holes and constant speed of formation of the strand, the filaments will all have the same diameter. Immediately underneath the spinneret, the filaments are cooled by means of water jets. Subsequently the cooled and hardened fibres undergo sizing and finally are wound onto the sleeves of the yarn storage machines. The size consists of a mixture made up of: starch, lubricating products, anti-static and anti-mould agents. The storing machine (winder) consists of a spindle rotating at high speed and a "zig-zagging" device for cross-winding the turns which are wound onto the plastic sleeves specially mounted on the spindle.

Z or S Twisted Yarns 20–40 pm

The yarn wound onto plastic sleeves (or "cakes"), after drying, is conveyed to the twisting department. The operation consists in unwinding the yarn from the sleeve and rewinding it onto plastic tubes. The tubes, rotating at high speed and by means of small rings, apply a twisting action to the glass yarn. The tube with the twisted yarn is ready for sale and will be subsequently used for the standard weaving operations.

The use of the first glass yarns with standard weaving machines (1950) proved difficult on account of the fragility of the yarn and the limited protection provided by the first rudimentary sizes.

It was therefore considered essential to use double twisted yarn. First the single yarn was twisted with 160 Z turns and then combined so as to form double yarn, providing an opposite twist (called S) with 150 turns for correct balancing.

The yarn thus produced stood up well to all the subsequent processing operations, but its cost was very high.

With the subsequent modifications made to textile machines, the use of ceramic yarn-guides and hard layered chromium plating on all the yarn travel paths, as well as the marked improvement in spinning sizes, it became possible to process single-twist yarns. The first single twists consisted in 40 Z turns (1965) which were further reduced to 28 Z turns (1975 to the present day).

At the same time, fabric impregnation improved considerably, allowing initially better penetration of the filaments by the bridging agent (fibreglass resin) and subsequently better bonding of the resin with he most exposed surface of the glass.

The range of printed circuits can be divided into he following types: rigid and multilayer. The standard rigid laminates have a thickness of 1.55 mm and are manufactured with 8 layers of 7628 fabric weighing 201–203 g/m$^2$. The number 7628 is a code defined by the IPC (Interconnecting and Packaging Electronic Circuits) standards and, in this case, indicates a glass fabric formed by yarn with a count of 68 Tex (68 g/1,000 m) with 12.6 weft yarns per cm and 17 warp yarns per cm. At present the yarn used for this fabric has 28 twisting turns per meter along the weft and warp and is formed by 9-micron filaments.

The multilayer laminates have a smaller thickness and thus become less rigid. The thicknesses range from 0.05 to 0.8 mm.

The fabrics used are of the following types (IPC designation): 1080, 2112, 2116, 2113, 2313, 1675, 2125 and 2165.

This entire range of fabrics is produced using yarns with 40 twisting turns per meter (both along the weft and along the warp) and the yarn counts are: 5.5, 11, 22 or 34 Tex with 5, 6 or 7-micron filaments.

The heights of the fabrics are an important variant and range from 96.5 to 132cm (initial use is being made of 142 cm). At present there are very wide tolerances as regards the various parameters which define the fabric.

On account of the increasingly more stringent specifications of printed circuits, the person skilled in the art is now forced to consider as critical certain aspects of the laminates, such as the surface wariness, the dimensional stability, the warpage, the suitability for hole-boring, the thickness, the dielectric constant, etc., so that it can be said that the characteristics of the laminate depend not only on the resins used, but also on the structure of the glass fabric.

Glass fabric, therefore, from being a simple support medium, has now become a fundamental component which is essential for the quality of the product. This fabric, as well as being influenced by the characteristics of the glass fibres described above, is also influenced by technological manufacturing factors.

As is known to the person skilled in the art, glass fabric is formed by an interwining arrangement or woven framework, comprising a warp and a weft.

Considering the structure of the woven network, the characteristics of the glass fabric directly affect the surface profile of the fibreglass resin laminate P(t), which is defined as:

$$P=R(t)+W(t)$$

where: R(t) is the maximum surface roughness due mainly to the copper and W(t) is the maximum underlying wariness due mainly to the support medium.

The parameter W(t) is a direct function of the glass fabric both as regards the type of yarn and intertwining of the weft with the warp.

The number of twists (per meter) of the yarn plays an important role in determining the amplitude of W(t).

A further anomaly of the fabric which causes difficulty as regards its use in laminates is the lack of uniformity in the diameters of its basic filaments, the negative influence of which is drastically increased at high twisting turns (25–40 turns per meter) and with inconsistency of twists per associated unit of measurement of the twisting system (more or less 25% with respect to the number of turns between start and end of reel). It cab cause lack of uniformity in the thickness of the fabric, problems of dimensional stability of the laminate owing to the presence of abnormal internal stresses and finally critical conditions during the hole boring process.

Finally a dangerous defect of the glass fabric consists in imperfect cleanliness owing to the presence of residues of organic compounds, such as starch, used in the weaving process and later removed, as explained below. Their presence in the laminate alters its chemical and physical properties. It is obvious that the twisted filaments are very compact and hence more difficult to clean owing to the difficulty with which heat is able to penetrate them and consequently owing to the difficulty with which the distillation vapours of the size present are able to escape.

Weaving is the basic operation for conversion of the yarn into fabric.

Transformation of the yarn into fabric is performed by means of the following working phases:

warping: operation which consists in transferring the glass yarns from the reels to the beams, keeping them taut and parallel;

gluing or sizing: operation by means of which the glass yarns are protected and lubricated with organic polymers, called dressings or sizes in order to make them suitable for the weaving process;

weaving: operation performed on weaving machines which iterwine groups of yarns perpendicular to each other; those which run vertically (at 0°) form the warp and those arranged at 90° form the weft; the intertwining arrangement of the yarns is known as the "weave";

finishing: which comprises the operations of:

de-sizing: performed thermally, during which the sizes are removed from the glass fabric treatment with surface agents: consisting in a chemical reaction between the surface of the glass and bonding agents, so that the fabric is made reactive towards resins in general.

The conventional technology now used in the manufacture of glass fabric involves the use of air looms, in which the weft yarn is blown towards the warp.

In air looms the yarn blown by the air jet must have a consistency which is markedly superior to that required for mechanical transportation, so that the tendency has been to use yarns with a high number of twists and an abundant amount of size.

This technological aspect conflicts with the possibility of producing zero-twist glass fabrics suitable for use in the manufacture of the latest generation printed circuits.

The Applicant, on the other hand, has made the particular choice of using rapier looms for the production of glass fabrics. Rapier looms are commonly used in the manufacture of textile products made of natural or synthetic fibre.

In order to use rapier loom in the manufacture, of fibre-glass fabrics, the Applicant has developed several original improvements. In this connection reference is made to EP 0477138 and EP 0477139.

SUMMARY OF THE INVENTION

It has now been discovered, and this discovery represents a subject of the present invention, that with a glass fabric consisting of a yarn with zero-six twists it is possible to manufacture laminates for printed circuits which satisfy the requisites arising from the progressive miniaturization of said circuits, together with the implications thereof from a technological and qualitative point of view. This fabric, in a preferred embodiment of the invention, is made using yarn with 0–6 twists per meter both along the weft and along the warp with proportionally less favourable results, it can also be made using yarn with 0–6 twists per meter either exclusively along the warp or exclusively along the weft (–40% and –60%, respectively).

Furthermore, the present invention relates to the use of glass fabrics, consisting of yarns with 0–6 twists for industrial uses as,a reinforcing material.

BRIEF DESCRIPTION OF THE DRAWINGS

The FIGS. 1A and 1B show profiles of a fabric according to the prior art, FIG. 1A with twisted yarns and according to the present invention, FIG. 1B with parallel yarns.

DETAILED DESCRIPTION OF THE INVENTION

The glass fabric according to the present invention is prepared from a glass yarn with zero twists in a preferred embodiment of the invention this yarn is used both along the warp and along the weft or with proportionally less favourable results only along the weft or only along the warp.

Yarn which has a number of twists per meter ranging from 0 to 6 is defined as zero-twist yarn.

Zero-twist glass yarn is known and used in some, industrial sectors, where the yarn counts (from 160 to about 2400 Tex) and the diameter values of the basic filaments (from 9 to 20 microns) of the yarns used are extremely high such that, from a technical and production point of view, they are considered to be a product which is altogether different from yarn for electrical engineering and electronics applications, since they are also made of al type of glass not suitable for electronic use.

In the electrical engineering and electronics sectors, where borosilicate glass (E) yarns are used and where, as said, the yarn counts (from 5.5 to 136 Tex) and the diameter values (from 5 to 9 microns) are considerably lower and the qualitative and technological requirements are somewhat more stringent, hitherto it has not been possible to manufacture fabrics using this yarn with zero twists, on account of its extremely delicate nature and the consequent impossibility of processing it.

At present, there exist two methods for the production of yarns with zero twist turns:

1. The most simple solution consists in replacement of the twisting machines with spooling machines. Instead of the classic system using tubes which twist the yarn, it is necessary to adopt a system for rewinding the yarn/which does not impart any twisting turns. The sleeve, which receives the yarn underneath the spinneret is dried and then conveyed away for spooling The spooler is a machine which, by causing a plastic spindle to rotate at high speed, rewinds the yarn from the sleeve without twisting. This operation is simple and economical in that the rewinding speed is higher than that of the twisting tubes and the investment outlay is of a more modest nature. The difficulties arise during the preparation of a good-quality textile yarn. In fact, glass yarn is extremely susceptible to wear and the filaments are easily broken if they are not suitably protected. Twisting, as already described above, performed an important role in holding together the 50–400filaments and the only purpose of the standard size was to make the yarn slide more easily. With zero-twist yarn the role of the size becomes of vital importance; it must ensure that defects do not arise during spinning by uniting the filaments of the yarn, protect the latter from friction and allow the yarn to remain soft and flexible. It should be remembered that the flexibility of glass, which has a very high Young's bending modulus, depends on the fact that it is composed of a set of basic filaments with a very small diameter (5–9 m). The reel which is delivered for the weaving operation must be very carefully prepared and must not, under any circumstances, have imperfections, especially along the edges where breakages of the filaments may occur with dramatic consequences.

2The most innovative solution is the production of the spool directly underneath the spinneret eliminating the subsequent operation of spooling described in the previous solution. The problem, which is currently being definitively resolved, consists in obtaining a constant diameter for the individual filaments during the phase of winding onto the spool which has different dimensions from the normal spinning sleeves or "cakes". It is therefore necessary to use a newly designed winding machine which has greater precision with regard to the automatic system for varying the number of turns of the spool so as to keep the winding speed and the pulling force absolutely constant. The size, in this case too, is of fundamental importance and its preparation must take into account that the drying operation after spinning is performed on a spool with dimensions different from a standard sleeve or "cake" normally used. This solution is the preferred one of the present invention because it uses the spool as it is supplied from spinning with. Out having to undergo handling during an additional operation (spooling) and therefore the zero-twist yarn thus produced will be subject to the first stresses only during the subsequent weaving operations.

The weaving operation is performed on rapier looms. In a preferred embodiment of the invention, the loom uses the rapier described in the aforementioned European patent applications.

In said preferred embodiment of the invention, the rapier, or otherwise called gripper, is characterized by the fact that on the external side of the lateral wall of the supporting gripper directed towards the tip of the shed there is provided a clamp for the weft yarn to be inserted into the shed. In particular, the fabric of the present invention is characterized by double wettability, with half the roughness value. Let us now consider the schematic diagram in the accompanying figure showing a profile view of a fabric with a twisted yarn of basic filaments of 5 µm, 40 twists, (1), and compare it with that of a fabric with yarn again consisting of 5 µm filaments which are not twisted and parallel, (2), obtained according to the present invention.

It can be clearly seen that with yarns with a low number of or zero twists W(t) is much thinner than in the case where there is a high number of twists. The profile of the laminate affects the quality of photographic reproduction of the image on the dry film for incision of the printed circuit.

Fabrics with such a low surface roughness also allow new revolutionary techniques to be adopted in the production of printed circuit boards, which envisage the direct transferability of the copper etched on the laminate, with enormous economic, ecological and technological advantages, such as a drastic reduction in the amount of copper used, the elimination of the etching operation with consequent elimination of the refluent acids, and greater fineness of the printed circuit tracks.

The advantages for the laminates produced with the new fabric can be summarized as follows:

reduction of the heat expansion coefficient $\alpha_z$, which is now very high; in fact $\alpha_z$ is reduced because the impregnated fabric is already in its condition of maximum expansion due to opening of the fibres resulting from the use of non-twisted yarn;

surface panel roughness with very low values;

improved hole-boring characteristics of the laminate and better boring quality;

surface free from inclusions and excess thicknesses;

high dimensional stability $D_{stab}$ since in glass fabric the yarns, not being twisted, are arranged so as to be perfectly aligned and, having a higher tensile modulus (no loss as a result of twisting) are more stable in both directions (at 0° and at 90°);

smaller number of microscopic voids, due to improved impregnation of the fabrics with zero-turn yarns;

greater resistance to "measles effect".

The use of the new fabric also offers advantages for the laminate manufacturing process. Since the new fabric has a shorter wettabilty time, there is a saving in the amount of solvent in the epoxy resin mixture which may be more viscous; higher speed of impregnation an hence greater production capacity the impregnation machine.

As regards fabrics intended for industrial reinforcing uses, produced with zero-twist yarn, the advantages can be summarized as follows:

improved modulus of rigidity, improved wettability, resulting in improved mechanical characteristics of the finished product;

reduced thickness and roughness for the same weight of the finished product lower cost.

The fabric according to the invention can be used for example as a base for spreading with PVC resins, as support fabrics for fire-resistant resins or fabrics for marine applications, for reinforcing thermoplastic and thermosetting resins, as decorative fabrics or internal and external mural fabrics, as well as for reinforcing paper or thermoplastic films and the like.

In a typical embodiment thereof, the fabric according to the present invention has the following characteristics:

| Weight | g/m² | 45–230 |
|---|---|---|
| Thickness | mm | 0.045–0.18 |
| Tensile strength (warp) | kg/cm | 6–26 |
| Elongation upon breakage (warp) | % | 1 |
| Tensile strength (weft) | kg/cm | 4–17 |
| Elongation upon breakage (weft) | % | 1.2 |
| Loss on ignition | % | 0.1–0.17 |
| Wet-Through test | 1/20 cm²/60" | <5 |
| Wet-Out test | min. | <2 |
| Surface pile | strands/1000 m | <2000 |
| Distortion | % | <1 |
| Textile defects | % | <1 |
| Loom performance | % | 90 |
| Loom speed | strokes/min. | 500 |
| Cost of yarn | % compared to Standard | 95 |
| Twisting turns | turns/m | 0–6 |
| Fabric waviness, $W_t$ | % compared to Standard | 50–60 |

We claim:

1. In a woven glass fabric for use as a reinforcement in a printed circuit board and comprised of continuous glass filament warp yarns and weft yarns, the improvement wherein at least one of the warp yarns and the weft yarns is zero-twist yarns made of glass filaments having a diameter of between about 5 and 9 microns and a yarn count of between about 5.5 and 136 Tex.

2. Glass fabric according to claim 1, wherein the warp yarns and the weft yarns are composed of zero-twist yarn.

3. Glass fabric according to claim 1, wherein only the weft yarns are composed of zero-twist yarn.

4. Glass fabric according to claim 1, wherein only the warp yarns are composed of zero-twist yarn.

5. Fabric according to claim 1, wherein the glass filaments are borosilicate (E) glass.

6. Fabric according to claim 2, characterized in that it has the following characteristics;

| Weight | g/m² | 45–230 |
|---|---|---|
| Thickness | mm | 0.045–0.18 |

7. Printed circuits comprising a laminate containing the glass fabric according to claim 1.

8. Process for manufacturing the fabric accord to claim 1, comprising weaving the fabric in a gripper loom.

9. Process according to claim 8, wherein the gripper loom has on an external side of a lateral wall directed towards a shed, a clamp for the weft yarns to be inserted into the shed.

* * * * *